(12) United States Patent
Chun et al.

(10) Patent No.: US 7,348,667 B2
(45) Date of Patent: Mar. 25, 2008

(54) SYSTEM AND METHOD FOR NOISE REDUCTION IN MULTI-LAYER CERAMIC PACKAGES

(75) Inventors: Sungjun Chun, Austin, TX (US);
Jason Lee Frankel, Wappingers Falls, NY (US); Anand Haridass, Austin, TX (US); Erich Klink, Schoenaich (DE); Brian Leslie Singletary, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 11/086,719

(22) Filed: Mar. 22, 2005

(65) Prior Publication Data

US 2006/0214190 A1    Sep. 28, 2006

(51) Int. Cl.
*H01L 23/34* (2006.01)
(52) U.S. Cl. .................... 257/723; 257/686
(58) Field of Classification Search ............. 257/723
See application file for complete search history.

(56) References Cited

U.S. PATENT DOCUMENTS

| | | | |
|---|---|---|---|
| 2,966,719 A | 1/1961 | Park | |
| 5,812,380 A | 9/1998 | Frech et al. | 361/794 |
| 2005/0224961 A1* | 10/2005 | Farquhar et al. | 257/723 |

OTHER PUBLICATIONS

U.S. Appl. No. 11/146,441, filed Jun. 6, 2005, Haridass et al.

\* cited by examiner

*Primary Examiner*—Long Pham
(74) *Attorney, Agent, or Firm*—Stephen J. Walder, Jr.; Casimer K. Salys

(57) ABSTRACT

A system and method for reducing noise in a multi-layer ceramic package are provided. With the system and method, additional shielding wires are inserted into the reference planes wherever there are no signal vias present. These additional lines in the reference planes force stronger signal interaction with the reference (vdd/gnd) thereby reducing the interaction between the signals in the signal layers. As a result, the noise present in the signals of the signal layers is reduced.

20 Claims, 5 Drawing Sheets

SYSTEM AND METHOD FOR NOISE REDUCTION IN MULTI-LAYER CERAMIC PACKAGES

BACKGROUND OF THE INVENTION

1. Technical Field

The present invention is generally directed to an improved integrated circuit package design. More specifically, the present invention is directed to a multi-layer ceramic package in which additional shielding lines are added to reduce noise.

2. Description of Related Art

As Very Large Semiconductor Integrated (VLSI) circuits become more dense, there is a need in the art to have semiconductor packaging structures that can take full advantage of the density and speed provided by state of the art VLSI devices. Present day modules made of ceramic, typically multilayered ceramic modules, are normally mounted onto cards or boards, with cards or boards combined together to form the central processing unit (CPU) of a computer. The multilayer ceramic (MLC) modules typically have VLSI chips mounted on the top surface.

Multilayer modules are used for the packaging of electronic components, especially integrated circuit chips. Both single chip modules (SCM) and multi chip modules (MCM) are widely used. The most common type of such modules is the multilayer ceramic packaging module. In this type of module, the layers consist of a ceramic or glass-ceramic material. However, other types of thick film technologies are known, such as glass epoxy and Teflon. An example of multilayer ceramic packages is provided in U.S. Pat. No. 5,812,380, issued to Frech et al. on Sep. 22, 1998, which is hereby incorporated by reference.

As integrated circuit speeds and packaging densities increase, the importance of the packaging technology becomes increasingly significant. For example, as devices approach gigahertz speed, inductance effects in the package become more significant. Such inductance effects may arise from switching, for example, and are particularly problematic in power and ground leads. Inductance effects in the package can cause ground bounce, signal cross-talk and the like. Increasing circuit size and speed also impact the heat dissipation ability of the package.

VLSI and Ultra Large Semiconductor Integrated (ULSI) chips are especially designed for high performance applications and are thus limited by noise. The noise is caused by a high number of simultaneously switching off-chip drivers (OCD noise) and by a high number of simultaneously switching latches and the associated logic gates (logic noise). Both noise sources impact and restrict the on-chip and off-chip performance and jeopardize the signal integrity. Both noise sources generate noise due to line-to-line coupling and due to the collapse of the voltage-ground (GND) system.

A multilayer ceramic fabrication process involves the formation of the green or unfired ceramic layers or sheets, the formation of the conductive paste, the screening of the conductive paste onto the green ceramic sheets and the stacking, laminating and firing of ceramic sheets into the final multilayer ceramic structure. These general processes are known in the art and are described, for example, in U.S. Pat. No. 2,966,719 issued to Park, which is hereby incorporated by reference.

The ceramic green sheet is formed by weighing out the proper portions of the ceramic powder and glass frit, and blending the particles by ball or other milling techniques. The organic binder comprising the thermoplastic resin, plasticizer and solvents is then mixed and blended with the ceramic and glass powders on a ball mill. A slurry or slip is cast into a tape form by extruding or doctor blading. The cast sheet is then allowed to be dried of the solvent constituent in the binder system. After the tape is completely dried, it is then cut into working blanks or sheets. Registration holes are formed in the blanks together with the via holes which are selectively punched in the working blanks. The via holes will eventually be filled with a conductive composition to allow for electrical connections from layer to layer in the multilayer ceramics structure.

The wiring layers in a multi-layer ceramic package are designed in a stacked triplate configuration with the signal wiring sandwiched between upper and lower reference planes (typically alternating in vdd/gnd polarity). These reference structures are meshed in a regular grid structure to allow via interconnections for the signal and power lines. This triplate structure is a controlled impedance environment that allows high speed signal propagation.

With increased signal rising and falling edge rates and bus signaling speeds, signals on these wiring layers interact with other signals on the signal layers above and below it through the meshed reference structure. This interaction, i.e. cross-talk, between high speed signals introduces inter-symbol interference (ISI) on the nets that severely limits the maximum signaling rates and performance on these nets. ISI is the distortion of a received signal, wherein the distortion is manifested in the temporal spreading and consequent overlap of individual pulses to the degree that the receiver cannot reliably distinguish between changes of state, i.e. between individual signal elements. At a certain threshold, inter-symbol interference will compromise the integrity of the received data.

Thus, it would be beneficial to have an improved structure for multi-layer ceramic packages that reduces cross-talk between wiring layers of the package. Moreover, it would be beneficial to have an improved structure for multi-layer ceramic packages that reduces cross-talk with no loss in wiring density allowed by the technology.

SUMMARY OF THE INVENTION

The present invention provides a system and method for reducing noise in a multi-layer ceramic package. With the system and method of the present invention, additional shielding wires or lines are inserted into the reference planes wherever there are no signal vias present. These additional wires or lines in the reference planes force stronger signal interaction with the reference (vdd/gnd) thereby reducing the interaction between the signals in the signal layers. As a result, the noise present in the signals of the signal layers is reduced.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
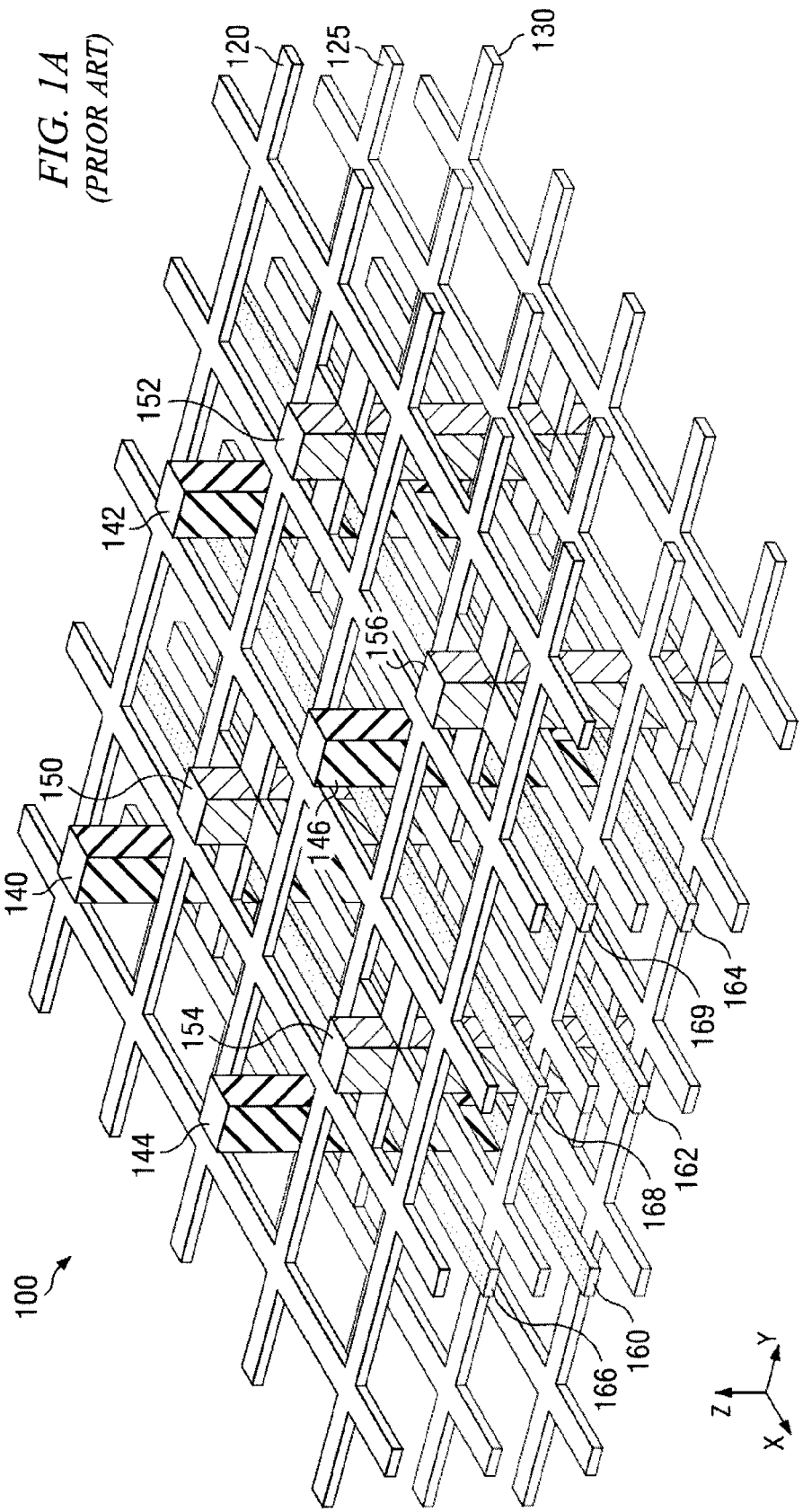
FIGS. 1A-1C are exemplary diagrams illustrating a multi-layered ceramic package in accordance with a known structure.
Figure 1B:
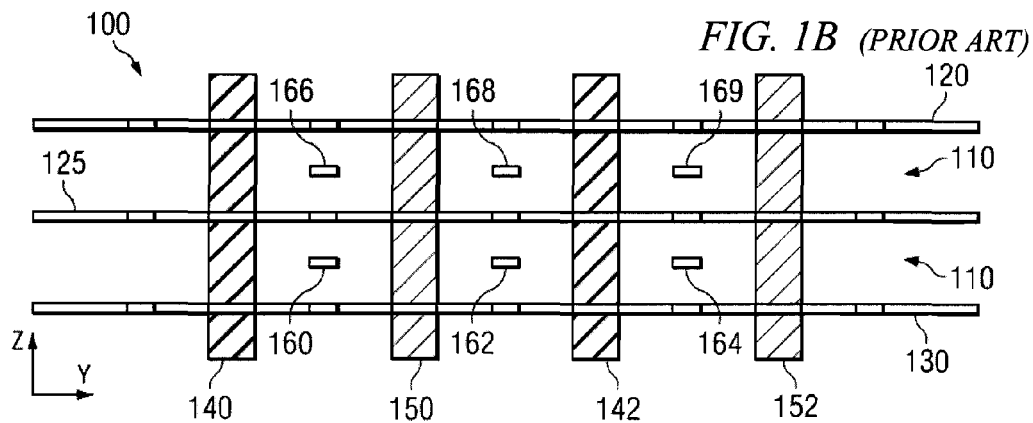
Figure 1C:
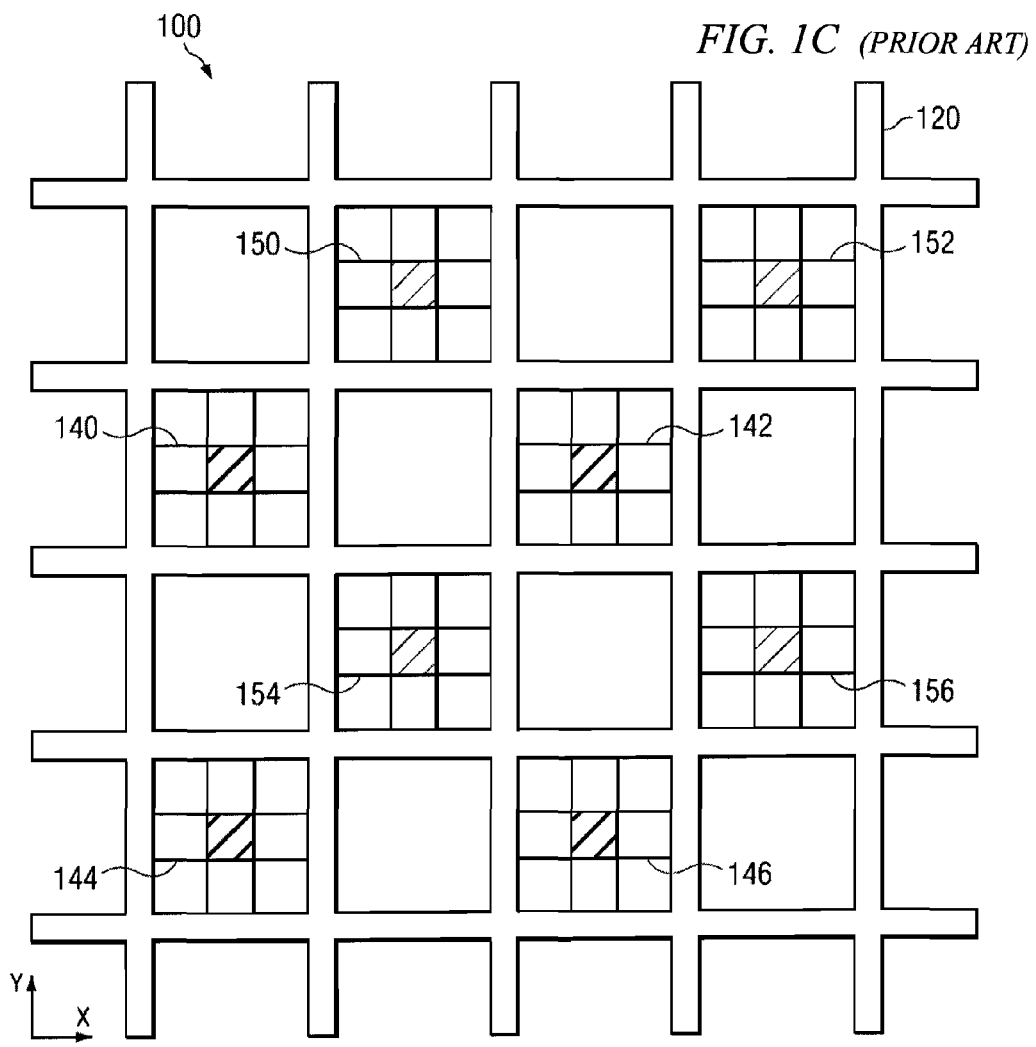

The present invention provides an improved multi-layered ceramic package configuration in which additional shielding wires or lines are provided to reduce cross-talk between signal planes. In order to illustrate the primary configuration differences between the improved multi-layered ceramic package configuration and known multi-layered ceramic packages, reference will first be made to FIGS. 1A-1C which illustrate various views of a known unshielded multi-layered ceramic package. FIG. 1A is an exemplary isometric view diagram illustrating a multi-layered ceramic package in accordance with a known structure. FIG. 1B is an exemplary cross-sectional view of the multi-layered ceramic package in accordance with a known structure. FIG. 1C is a top view of a ceramic package in accordance with a known structure.

As shown in FIGS. 1A-1C, the multi-layered ceramic package 100 includes signal planes 110 sandwiched between reference mesh planes 120, 125 and 130. The signal planes 110 are formed as signal wires formed in a ceramic substrate. The reference mesh planes 120, 125 and 130 are ceramic layers with metal wire mesh formed therein. The metal wire mesh of the reference mesh planes 120, 125 and 130 provide voltage (vdd) and ground (gnd) lines, respectively. The vdd lines are accessed by vertical vias 140-146 and x-hatch structures with which the vdd vias tie into the vdd mesh plane 125. The gnd lines are accessed by ground vias 150-156 and x-hatch structures with which the gnd vias tie into the ground mesh planes 120 and 130. Additional signal planes 110 and mesh planes 120, 125 and 130 may be provided in the multi-layered ceramic package 100 as is desired for the particular implementation. FIG. 1C illustrates the x-hatch structures in the reference planes for tying the vdd and gnd vias 140-146 and 150-156 to their respective voltage and ground lines in the reference planes 120 and 130.

FIG. 1B illustrates the planes 110-130 in greater detail. As shown in FIG. 1B, the signal planes 110 are separated from one another by reference mesh planes 120, 125 and 130. Because these reference mesh planes 120, 125 and 130 do not exert much influence on the signal planes 110, the signal lines 160-169 in the signal planes 110 are inductively coupled to one another. This gives rise to noise in the signal lines due to cross-talk interference. Cross-talk is the undesired, primarily inductive, interaction between two adjacent metal lines in a multi-layered metallization scheme of an integrated circuit.

As discussed above, as edge rates and bus signaling speeds increase, signal lines 160-169 on these signal layers 110 interact with other signal lines 160-169 on the same signal layer 110 and other signal layers 110 above and below it through the reference mesh planes 120, 125 and 130. This cross-talk interaction between high speed signals introduces inter-symbol interference (ISI) on the nets that severely limits the maximum signaling rates and performance on these nets. Thus, in order to be able to achieve higher signaling rates and performance, it is necessary to minimize the interference in signal lines 160-169 of the signal planes 110. Therefore, it is necessary to have a structure that minimizes the cross-talk interference experienced by signal lines in one signal plane due to signal lines in other signal planes.

In the printed circuit board art, shielding is provided by way of a metal layer that is placed between the printed circuit board and other elements of the system. As a result, the metal layer may act as a voltage conductor and/or ground and also provides shielding of the metal wires present on the printed circuit board. While such an approach is feasible in the printed circuit board art, such an approach is not possible when fabricating multi-layer ceramic packages because it is necessary to have as much dielectric to dielectric, e.g., ceramic to ceramic, contact for adhesion of the layers in the multi-layer ceramic packages. That is, if a metal layer were provided between signal layers of a multi-layer ceramic package, the ceramic substrates of the signal layers would not adhere to the metal layer. Thus, it is not possible to use the same approach as is provided by the printed circuit board art with the fabrication of multi-layer ceramic packages.

The present invention achieves the shielding affects of a metal layer without introducing the problems of adhesion that would be caused by a full metal layer between signal layers in a ceramic multi-layer package. With the present invention, additional signal lines are inserted in the mesh layers of a ceramic multi-layer package to provide shielding of the signal lines in the signal layers. While these additional signal lines, also referred to herein as reference lines, add additional metal to the mesh layers, the ceramic substrate of the mesh layers are still able to contact the ceramic substrate of the signal layers. As a result, adhesion of the layers is still made possible while providing the additional shielding affect to minimize noise in the signal lines of the signal layers.

Figure 2A:
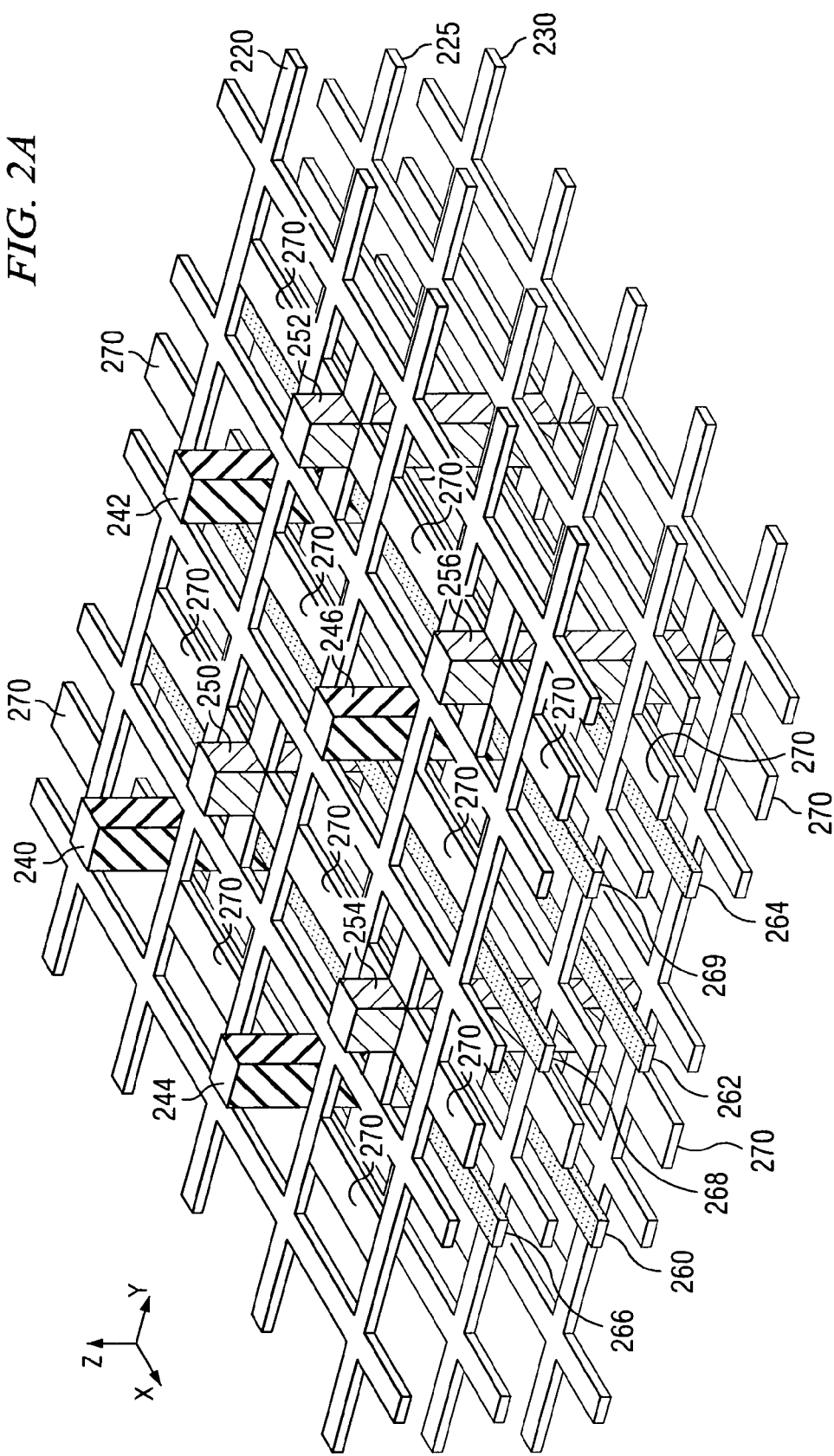
FIGS. 2A-2C are exemplary diagrams illustrating a multi-layered ceramic package in accordance with one exemplary embodiment of the present invention.
Figure 2B:
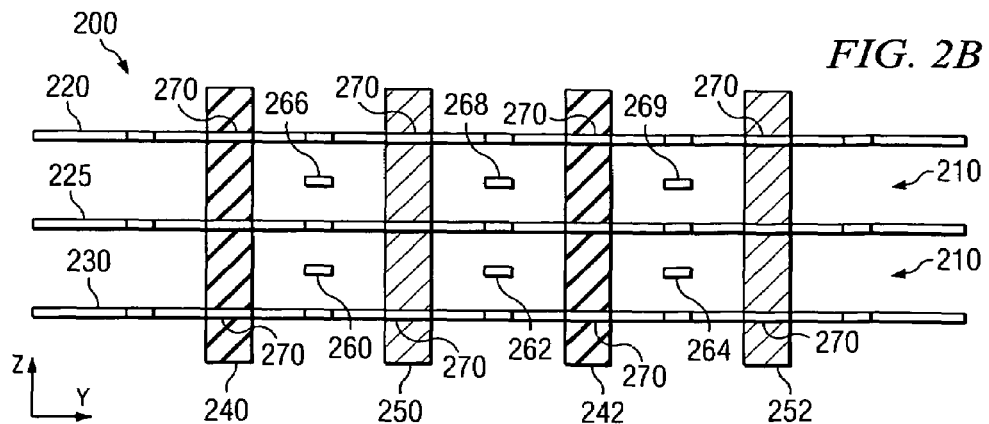
Figure 2C:
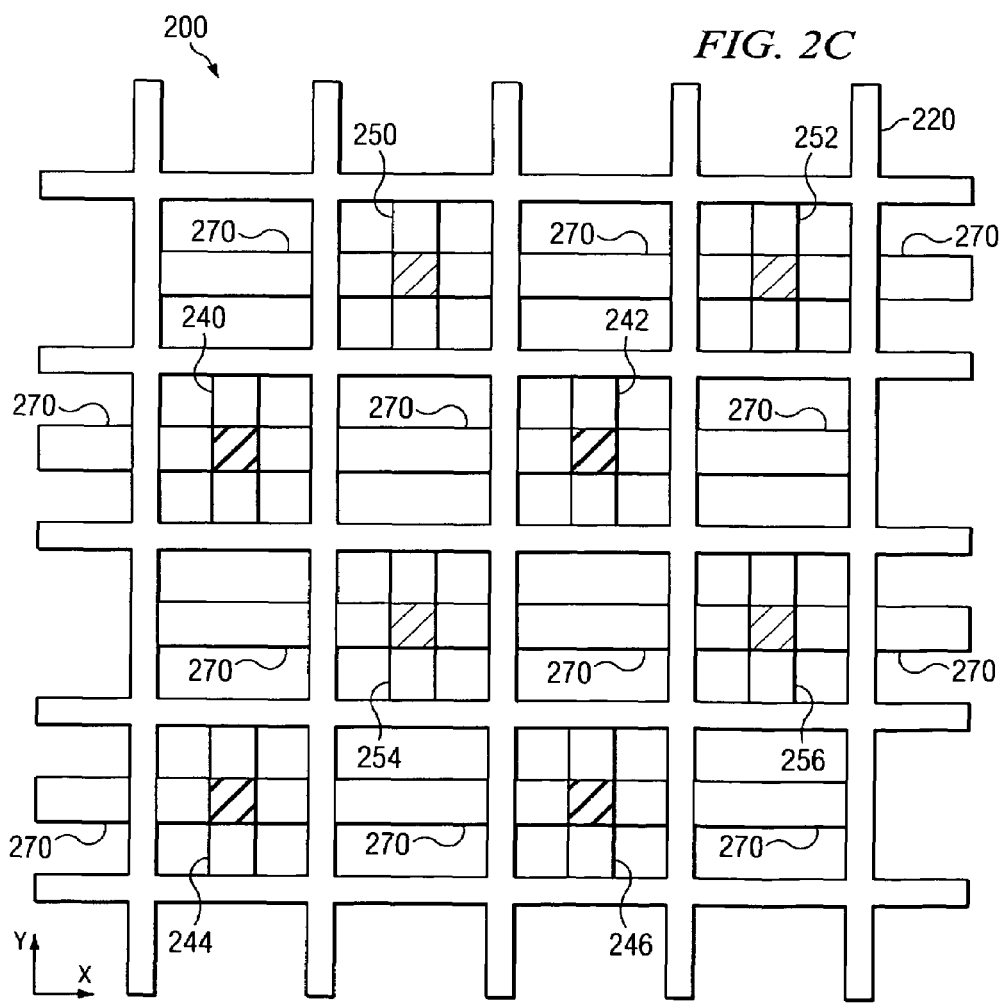

FIGS. 2A-2C are exemplary diagrams illustrating a multi-layered ceramic package in accordance with one exemplary embodiment of the present invention. The structure shown in FIGS. 2A-2C resembles that illustrated in FIGS. 1A-1C with the exception that additional reference wires or lines 270 are provided in the reference mesh planes 220, 225 and 230. These additional reference lines 270 are provided in portions of the reference mesh planes 220, 225 and 230 where vias 240-246 and 250-256 are not present.

The portions of the reference mesh planes 220, 225 and 230 where these additional reference lines 270 are to be placed may be determined during package design time in which the design of the various planes of the multi-layered ceramic package 200 is generated. At this time, those portions of the grids generated for each reference mesh plane 220, 225 and 230 in which vias 240-246 and 250-256 are present may be identified. In addition, those portions of the grids where vias 240-246 and 250-256 are not present may also be identified. Based on this identification of portions of the grids for the various reference mesh planes 220, 225 and 230 where vias 240-246 and 250-256 are not present, additional reference lines 270 may then be added to the design in the reference mesh planes 220, 225 and 230 at the locations where there are no vias 240-246 and 250-256.

In fabrication, the additional reference lines 270 are formed in the reference mesh planes 220, 225 and 230 in a manner similar to the manner that the signal lines 260-269 are formed. The fabrication of signal lines in a multi-layered ceramic package is generally known in the art and thus, a detailed description of such is not provided herein.

The additional reference lines 270 are formed in the reference mesh planes 220, 225 and 230 and are in connection with the metal wire mesh formed in these planes. As a result, the additional reference lines 270 take on the polarity of the particular reference mesh plane that they are inserted in, i.e. the polarity of voltage vdd or ground gnd. The additional reference lines 270 may be place anywhere there is no via present in the reference mesh planes 220, 225 and 230 and thus, may be offset from the signal lines 260-269 as shown, or may be in alignment with the signal lines 260-269. The additional reference lines 270 provide a shielding affect between the signal lines 260-269 of the signal planes 210. That is, the signal lines 260-269 of the signal planes 210 are more highly coupled to the additional reference lines 270 than the signal lines 260-269 of the other signal planes 210 above and below the current signal plane. As a result, cross-talk interference between signal lines 260 of the signal planes 210 is reduced.

To illustrate this reduction in cross-talk interference, consider the following relationships. For signal lines that are coupled over a length 1, the near-end noise reaches a limiting value, i.e. saturated noise, given by the equation:

$$V_{NE}(sat)=V_i(K_c+K_L)/4$$

where $V_{NE}(sat)$ is the near end saturated noise voltage, $V_i$ is an input voltage, $K_c$ is a capacitive coupling factor, and $K_L$ is an inductive coupling factor. The result of this equation is proportional to $(K_c+K_L)$.

The far end noise increases linearly with coupled length and is inversely related to the rise time. The noise voltage is given approximately by:

$$V_{FE}=0.5V_i(K_c-K_L)(L_{11}C_{11})^{1/2}(1/t_r)$$

where $V_{FE}$ is the noise voltage at the far end of the signal line, Vi is an input voltage, Kc is a capacitance coupling factor, KL is an inductance coupling factor, $L_{11}$ is self inductance of line 1 ($L_{22}$ would be self inductance of line 2 and $L_{12}$ would be the mutual inductance between lines 1 and 2), $C_{11}$ is self capacitance of line 1 ($C_{22}$ would be self capacitance of line 2 and $C_{12}$ would be the mutual capacitance between lines 1 and 2), $t_r$ is the rise time of the signal on the aggressor signal wire. The result of the far end noise voltage equation is proportional to $(K_c-K_L)$ wherein the capacitive and inductive coupling factors are $K_c=C_{12}/C_{11}$ and $K_L=L_{12}/L_{11}$.

Using the above relationships, for a glass ceramic multi-layered package having a configuration similar to the structure shown in FIGS. 1A-1C, calculating (Kc+KL) and (Kc-KL) due to 8 surrounding aggressor nets on a victim net in the middle (3 from a signal layer above, 2 from adjacent neighbor signal lines in the same signal layer as the victim net, and 3 from a signal layer below) the near end noise and far end noise are determined to be as follows:

| NE Noise ~$K_c$ + $K_L$ | | | FE Noise ~$K_c$ − $K_L$ | | |
|---|---|---|---|---|---|
| 0.0091 | 0.0531 | 0.0106 | −0.0055 | −0.0209 | −0.0068 |
| 0.0176 | Victim Net | 0.0184 | −0.0086 | Victim Net | −0.0095 |
| 0.0106 | 0.0535 | 0.0089 | −0.0068 | −0.0213 | −0.0053 |
| | Sum 0.1818 | | | Sum −0.0847 | |

For a glass ceramic multi-layered package according to the improved configuration of the present invention, as shown in FIGS. 2A-2C, for example, calculating $K_C+K_L$ and $K_C-K_L$ due to 8 surrounding aggressors on a victim net in the middle results in the following table:

| NE Noise ~$K_c$ + $K_L$ | | | FE Noise ~$K_c$ − $K_L$ | | |
|---|---|---|---|---|---|
| 0.0017 | 0.0376 | 0.0046 | −0.0012 | −0.0138 | −0.0036 |
| 0.0077 | Victim Net | 0.0092 | −0.0037 | Victim Net | −0.0050 |
| 0.0045 | 0.0379 | 0.0017 | −0.0036 | −0.0141 | −0.0012 |
| | Sum 0.1049 | | | Sum −0.0462 | |

As can be seen from the above, a dramatic improvement in both the near end noise and the far end noise is seen by the inclusion of the additional signal lines in the reference mesh layers of the multi-layered ceramic package. When simulating the glass ceramic structures above using 50 ohm source impedance, 50 ohm termination impedance, 5 cm long signal lines, a rise time of 25 ps, and input voltage of 1 volt, the following noise amplitudes on the victim net occur:

| | NE Noise | NE % Improvement | FE Noise | FE % Improvement |
|---|---|---|---|---|
| Unshielded Structure | 24.4 mV | — | −308.2 mV | — |
| Shielded Structure | 14.7 mV | −39.8% | −182.9 mV | −40.6% |

Thus, a 40% reduction in near end and far end noise may be achieved by including the additional shielding signal lines in the reference mesh layers of the multi-layered ceramic package.

While the examples described above are for orthogonal wiring on a glass ceramic module, the present invention is not limited to such. To the contrary, the present invention may be applied to any multi-layered ceramic package in which portions of reference mesh layers that do not have vias may be identified for inclusion of additional shielding signal lines. For example, the present invention may be implemented on 9211 modules, i.e. alumina modules, and with diagonal wiring configurations. Thus, the present invention is equally applicable to any material set that uses signals referenced to meshed planes.

In addition, it should be noted that the techniques for fabricating the multi-layered ceramic package may be any known technique depending upon the particular materials used. For example, the greensheet technique described above in the Background of the Invention may be used to form a multi-layered ceramic package in accordance with the present invention. Of course such techniques are modified by introduction of the present invention to include additional signal lines in the reference planes of the multi-layered ceramic package at locations where there are no vias present. Other known fabrication techniques may be used with the present invention without departing from the spirit and scope of the present invention.

Figure 3:
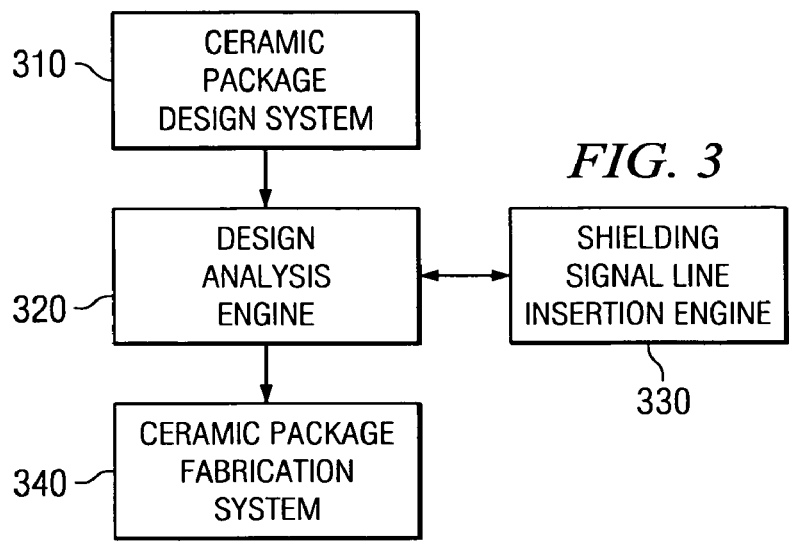
FIG. 3 is an exemplary block diagram of a system for generating a shielded multi-layered ceramic package in accordance with one exemplary embodiment of the present invention.

FIG. 3 is an exemplary block diagram of a system for generating a shielded multi-layered ceramic package in accordance with one exemplary embodiment of the present invention. As shown in FIG. 3, the system includes a ceramic package design system 310 coupled to a design analysis engine 320. Also coupled to the design analysis engine 320 is the shielding signal line insertion engine 330 and a ceramic package fabrication system 340. The ceramic package design system 310 provides a design for the multi-layered ceramic package identifying the placement of signal lines, voltage and ground reference mesh layers, voltage and ground vias, and the like. The ceramic package design data is provided to the design analysis engine 320 which analyzes the design to identify, among other things, portions of the reference mesh layers where vias are not present and where additional shielding signal lines may be placed.

The identified portions of the reference mesh layers where vias are not present are provided to the shielding signal line insertion engine 330 along with the ceramic package design data. Based on the identified portions of the reference mesh layers, the shielding signal line insertion engine 330 inserts additional shielding signal lines, i.e. reference lines, in the ceramic package design at the identified locations in the reference mesh layers where there are no vias. The resulting ceramic package design is provided to the ceramic package fabrication system 340 for fabrication of the multi-layered ceramic package.

Figure 4:
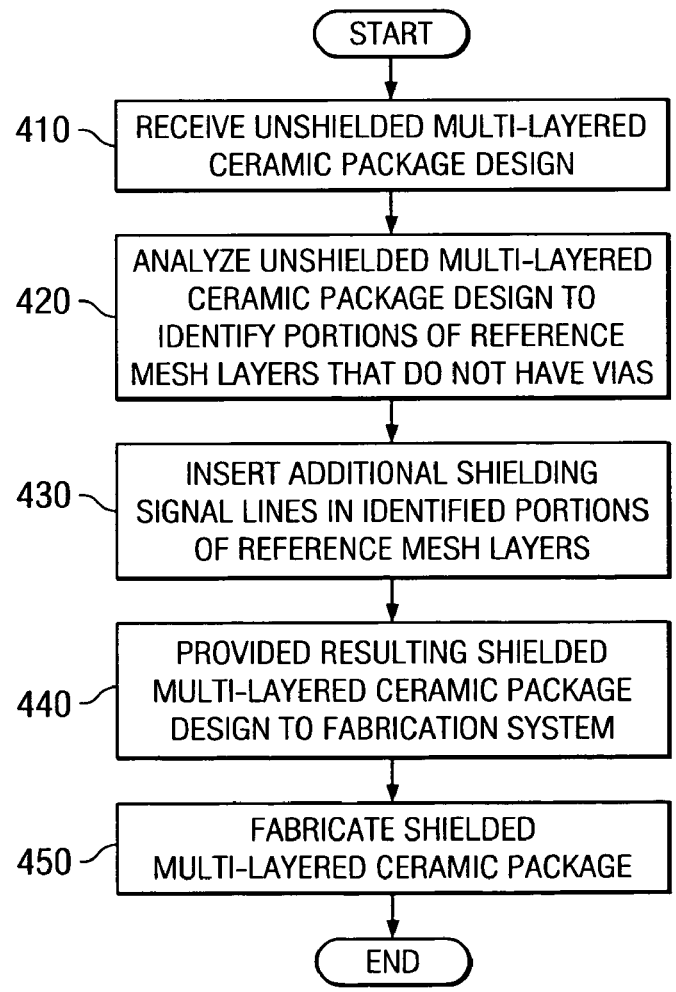
FIG. 4 is a flowchart outlining an exemplary operation of the present invention.

FIG. 4 is a flowchart outlining an exemplary operation of the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 4, the operation starts by receiving an unshielded multi-layered ceramic package design (step 410). The unshielded multi-layered ceramic package design is analyzed to identify portions of reference mesh layers where vias are not present (step 420). Additional shielding signal lines are inserted into the design at the identified portions of the reference mesh layers where vias are not present (step 430). The resulting shielded multi-layered ceramic package design is then provided to a fabrication system (step 440) which fabricates the shielded multi-layered ceramic package based on the shielded multi-layered ceramic package design (step 450). The operation then terminates.

Thus, the present invention provides a mechanism for designing a fabricating a shielded multi-layered ceramic package in which cross-talk noise between signal lines in signal layers of the multi-layered ceramic package is minimized. With the shielded multi-layered ceramic package of the present invention, additional shielding signal lines are inserted into portions of the reference mesh layers of the ceramic package where vias are not present. The result is that the signal lines are more highly coupled with the additional shielding signal lines than other signal lines in other signal layers of the multi-layered ceramic package, thereby reducing the cross-talk interference between signal lines.

It is important to note that while aspects of the present invention have been described in the context of a fully functioning data processing system, those of ordinary skill in the art will appreciate that processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A multi-layered ceramic package, comprising:
   a plurality of signal layers, each signal layer having one or more signal lines;
   at least one reference mesh layer adjacent one or more signal layers of the plurality of signal layers, wherein the at least one reference mesh layer comprises a mesh of lines referenced by connection to either voltage (vdd) or ground (gnd); and
   one or more shielding reference lines provided in one or more reference mesh layers of the at least one reference mesh layer, wherein the one or more shielding reference lines are inserted into portions of the mesh of the one or more reference mesh layers between the lines referenced by connection to either vdd or gnd, and wherein the one or more shielding reference lines force a stronger interaction between themselves and the one or more signal lines than an interaction between signal lines of different signal layers.

2. The multi-layered ceramic package of claim 1, further comprising:
   at least one via running through one or more signal layers of the plurality of signal layers and one or more reference mesh layers of the at least one reference mesh layer.

3. The multi-layered ceramic package of claim 2, wherein the one or more shielding reference lines are located in portions of the one or more reference mesh layers, of the at least one reference mesh layer, where vias of the at least one via are not present.

4. The multi-layered ceramic package of claim 1, wherein the at least one reference mesh layer includes at least two reference mesh layers, and wherein each signal layer of the plurality of signal layers is sandwiched between two reference mesh layers of the at least two reference mesh layers.

5. The multi-layered ceramic package of claim 1, wherein the plurality of signal lines are arranged in one of an orthogonal and a diagonal wiring pattern.

6. The multi-layered ceramic package of claim 1, wherein the multi-layered ceramic package is a glass-ceramic package.

7. A system for fabricating a multi-layered ceramic package, comprising:
 a multi-layered ceramic package design system that provides an unshielded multi-layered ceramic package design, wherein the unshielded multi-layered ceramic package design includes a plurality of signal layers and at least one reference mesh layer adjacent one or more signal layers of the plurality of signal layers;
 a shielding signal line insertion engine that inserts, into the unshielded multi-layered ceramic package design, additional shielding reference lines into the at least one reference mesh layer to generate a shielded multi-layered ceramic package design; and
 a ceramic package fabrication system that fabricates the multi-layered ceramic package based on the shielded multi-layered ceramic package design.

8. The system of claim 7, wherein the unshielded multi-layered ceramic package design further includes one or more vias running through one or more signal layers of the plurality of the signal layers and one or more reference mesh layers of the at least one reference mesh layer.

9. The system of claim 8, further comprising:
 a design analysis engine that analyzes the unshielded multi-layered ceramic package design to identify portions of the at least one reference mesh layer that do not include the one or more vias.

10. The system of claim 9, wherein the shielding signal line insertion engine inserts additional shielding reference lines into the at least one reference mesh layer by inserting the additional shielding reference lines at the identified portions of the at least one reference mesh layer that do not include the one or more vias.

11. The system of claim 7, wherein the at least one reference mesh layer includes at least two reference mesh layers, and wherein each signal layer of the plurality of signal layers is sandwiched between two reference mesh layers of the at least two reference mesh layers.

12. The system of claim 7, wherein the plurality of signal lines are arranged in one of an orthogonal and a diagonal wiring pattern.

13. The system of claim 7, wherein the multi-layered ceramic package is a glass-ceramic package.

14. The multi-layered ceramic package of claim 1, wherein the one or more shielding reference lines reduce cross-talk interaction between signal lines of a same signal layer and cross-talk interaction between signal lines of different signal layers.

15. The multi-layered ceramic package of claim 1, wherein the plurality of signal layers and the at least one reference mesh layer comprise ceramic substrates, and wherein the ceramic substrates of the plurality of signal layers are adhered to the ceramic substrate of the at least one reference mesh layer.

16. The multi-layered ceramic package of claim 1, wherein the one or more shielding reference lines are signal lines coupled to a metal wire mesh formed in the at least one reference mesh layer, and wherein the one or more shielding reference lines have a polarity of the metal wire mesh formed in the at least one reference mesh layer.

17. The multi-layered ceramic package of claim 1, wherein the one or more shielding reference lines reduce at least one of near end or far end noise of the one or more signal lines by approximately forty percent.

18. The system of claim 7, wherein the at least one reference mesh layer includes one or more shielding reference lines, and wherein the one or more shielding reference lines reduce cross-talk interaction between signal lines of a same signal layer and cross-talk interaction between signal lines of different signal layers.

19. The system of claim 7, wherein the plurality of signal layers and the at least one reference mesh layer comprise ceramic substrates, and wherein the ceramic substrates of the plurality of signal layers are adhered to the ceramic substrate of the at least one reference mesh layer.

20. The system of claim 7, wherein the at least one reference mesh layer includes one or more shielding reference lines, the one or more shielding reference lines are signal lines coupled to a metal wire mesh formed in the at least one reference mesh layer, and wherein the one or more shielding reference lines have a polarity of the metal wire mesh formed in the at least one reference mesh layer.

* * * * *